(12) United States Patent
Cruz-Uribe et al.

(10) Patent No.: US 9,331,260 B2
(45) Date of Patent: May 3, 2016

(54) PIEZOELECTRIC MECHANISM HAVING ELECTRODES WITHIN THIN FILM SHEET THAT ARE SUBSTANTIALLY PERPENDICULAR TO SUBSTRATE

(75) Inventors: Tony S. Cruz-Uribe, Corvallis, OR (US); Peter Mardilovich, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 625 days.

(21) Appl. No.: 13/703,121

(22) PCT Filed: Jun. 30, 2010

(86) PCT No.: PCT/US2010/040685
§ 371 (c)(1),
(2), (4) Date: Dec. 10, 2012

(87) PCT Pub. No.: WO2012/002965
PCT Pub. Date: Jan. 5, 2012

(65) Prior Publication Data
US 2013/0105594 A1    May 2, 2013

(51) Int. Cl.
*H01L 41/22*    (2013.01)
*H01L 41/047*    (2006.01)
(Continued)

(52) U.S. Cl.
CPC .......... *H01L 41/047* (2013.01); *B05B 17/0653* (2013.01); *B41J 2/14233* (2013.01); *B41J 2/161* (2013.01); *B41J 2/1626* (2013.01);
(Continued)

(58) Field of Classification Search
CPC ....... H01L 41/047; H01L 41/22; H01L 41/29; H01L 41/0973; H01L 41/257
See application file for complete search history.

(56) References Cited

U.S. PATENT DOCUMENTS 5,592,042 A * 1/1997 Takuchi et al. ............... 310/328
6,043,587 A    3/2000 Jaenker
(Continued)

FOREIGN PATENT DOCUMENTS

EP    0526048    2/1993
JP    05055657    3/1993
(Continued)

OTHER PUBLICATIONS

Sakata J et al: "Preparation of organic thin films by an electrospray technique I. Crystal forms and their orientation in poly(vinylidene fluoride) films", Thin Solid Films, vol. 195, No. 1-2, Jan. 1, 1991, pp. 175-184, XP025852129, ISSN: 0040-6090.
(Continued)

*Primary Examiner* — Selim Ahmed
(74) *Attorney, Agent, or Firm* — Michael A. Dryja

(57) ABSTRACT

A piezoelectric actuator is formed by forming first and second electrodes on a substrate, and depositing a material on the substrate and between side surfaces of adjacent first and second electrodes to form a thin film sheet within which the first and the second electrodes extend from a first surface of the thin film sheet towards a second surface of the thin film sheet opposite the first surface. The second electrode is interdigitated in relation to the first electrode. The side surfaces of the first and the second electrodes are at least substantially perpendicular to the substrate. The thin film sheet is to physically deform in response to an electric field induced within the thin film sheet via application of a voltage across the first and the second electrodes.

18 Claims, 12 Drawing Sheets

(51) Int. Cl.
   *B41J 2/14* (2006.01)
   *B41J 2/16* (2006.01)
   *H01L 41/09* (2006.01)
   *H01L 41/29* (2013.01)
   *B05B 17/06* (2006.01)
   *H01L 41/257* (2013.01)

(52) U.S. Cl.
   CPC ............ *B41J 2/1631* (2013.01); *B41J 2/1642* (2013.01); *B41J 2/1646* (2013.01); *H01L 41/0973* (2013.01); *H01L 41/22* (2013.01); *H01L 41/257* (2013.01); *H01L 41/29* (2013.01)

(56) References Cited

U.S. PATENT DOCUMENTS

| | | | |
|---|---|---|---|
| 7,378,782 B2 | 5/2008 | McKinstry et al. | |
| 7,484,280 B2 | 2/2009 | Yajima et al. | |
| 7,520,585 B2 | 4/2009 | Nagashima | |
| 7,621,622 B2 | 11/2009 | Kachi | |
| 2009/0033177 A1* | 2/2009 | Itaya | H03H 3/02 310/335 |

FOREIGN PATENT DOCUMENTS

| | | |
|---|---|---|
| JP | H08283932 | 10/1996 |
| JP | 2001085753 | 3/2001 |
| WO | WO-2009025145 | 2/2009 |

OTHER PUBLICATIONS

Supplementary European Search Report for Application No. EP10854227.5. Report issued Feb. 5, 2014.

\* cited by examiner

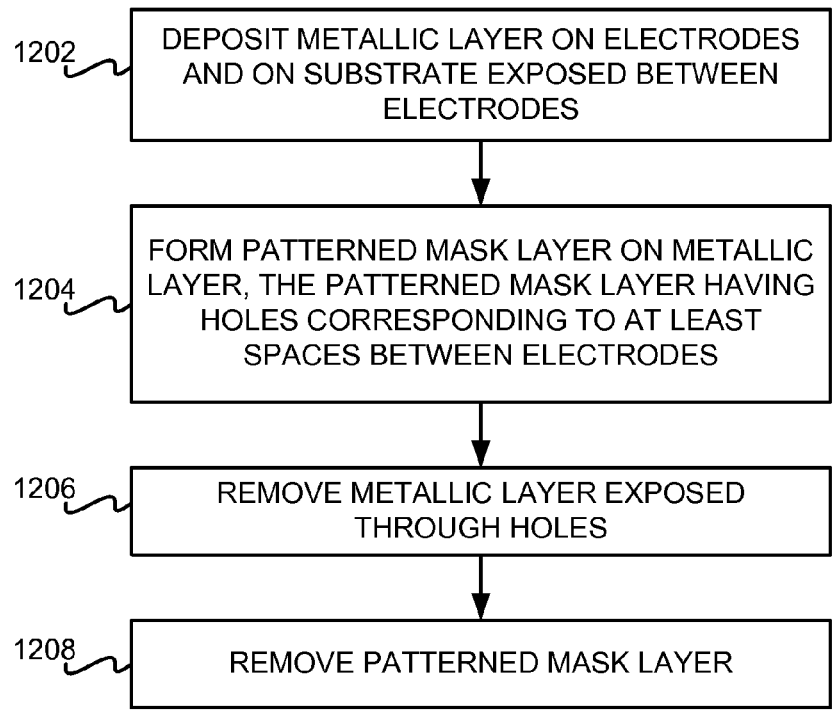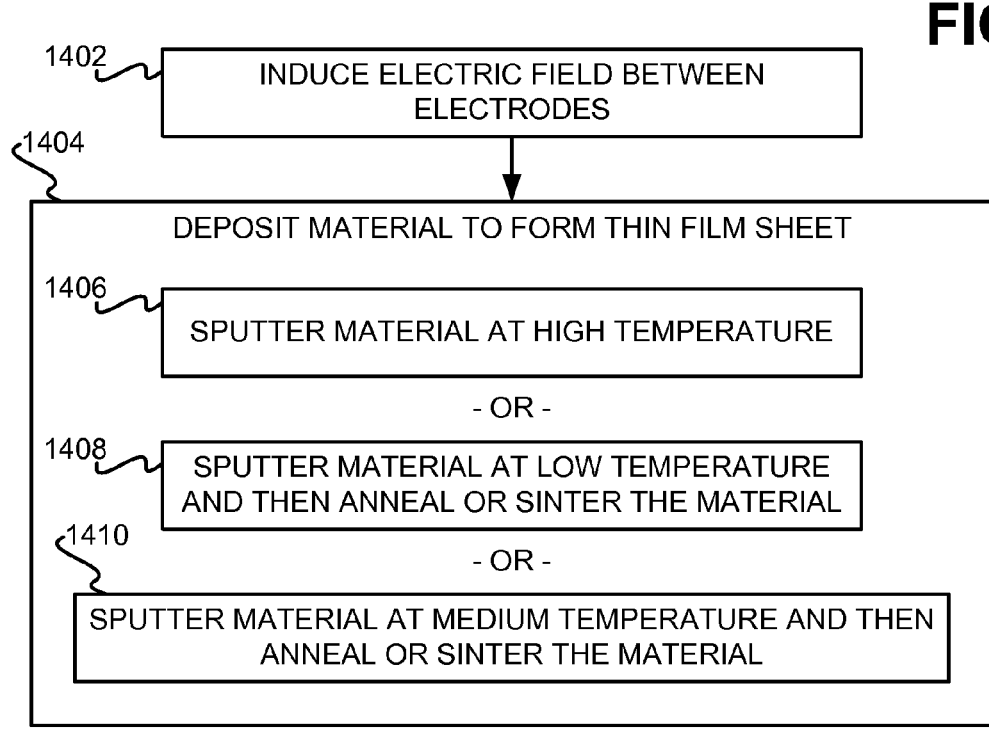

PIEZOELECTRIC MECHANISM HAVING ELECTRODES WITHIN THIN FILM SHEET THAT ARE SUBSTANTIALLY PERPENDICULAR TO SUBSTRATE

RELATED APPLICATIONS

The present patent application is related to the previously filed and presently pending PCT international patent application entitled "Piezoelectric actuator having embedded electrodes," filed on Oct. 30, 2009, and assigned patent application number PCT/US09/62866.

BACKGROUND

Fluid-ejection devices are employed to eject droplets of fluid. For example, inkjet printing devices eject droplets of ink onto media like paper to form images on the media. One type of fluid-ejection device is a piezoelectric fluid-ejection device. In a piezoelectric fluid-ejection device, piezoelectricity is used to eject mechanically droplets of fluid. In particular, an electric field is induced within a flexible sheet of piezoelectric material to cause the sheet to physically deform. Physical deformation of the sheet reduces the volume of fluid in an adjacent chamber, resulting in one or more droplets of fluid being ejected.

BRIEF DESCRIPTION OF THE DRAWINGS

FIG. 11 is a flowchart of an example method for forming a metallic layer on electrodes of a piezoelectric actuator.

FIG. 13 is a flowchart of an example method for depositing a material between electrodes to form a thin film sheet of a piezoelectric actuator.

DETAILED DESCRIPTION OF THE DRAWINGS

Figure 1:
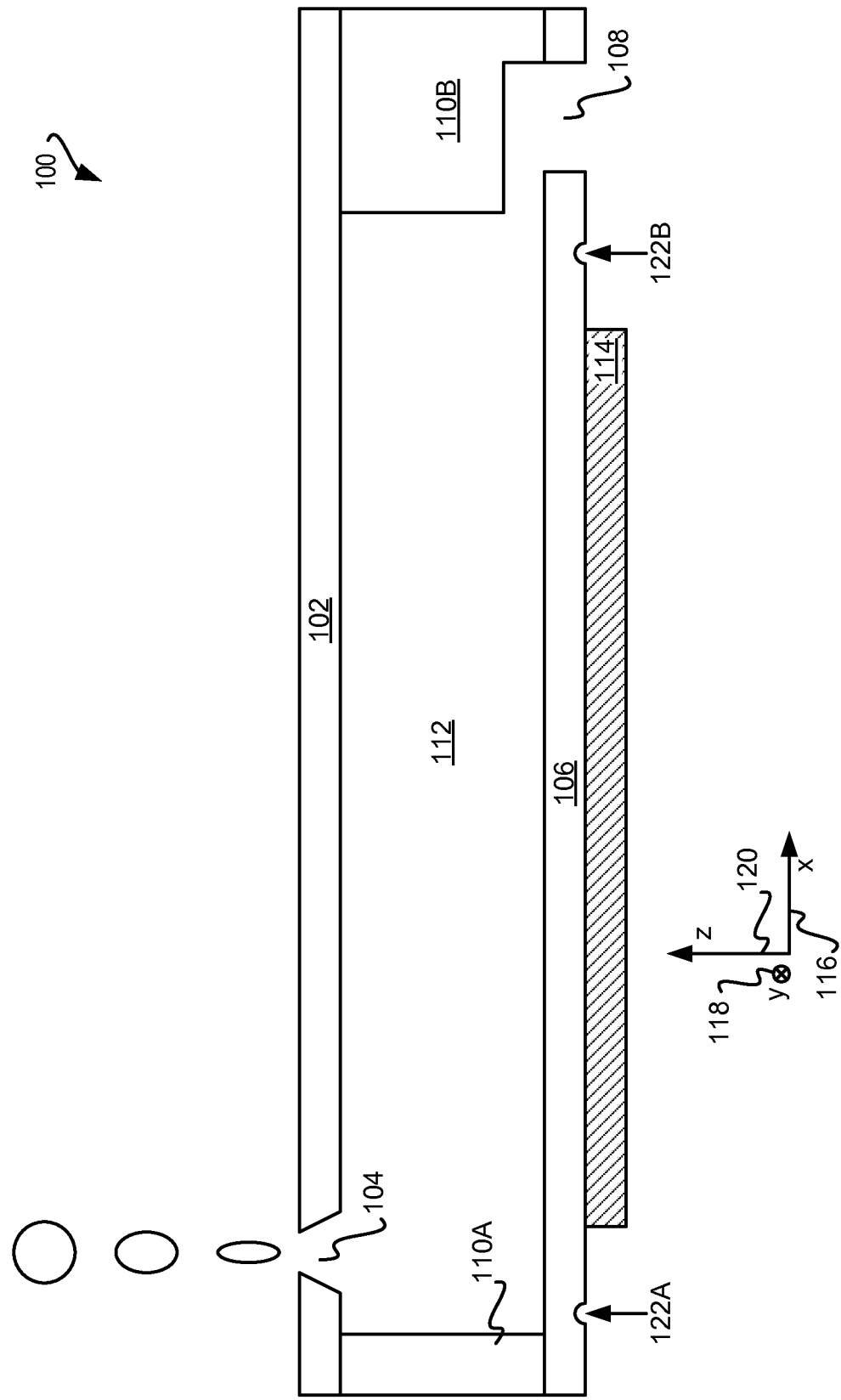
FIG. 1 is a diagram of an example cross-sectional side view of a piezoelectric fluid-ejection assembly.

As noted in the background, in a piezoelectric fluid-ejection device, an electric field is induced within a flexible sheet of piezoelectric material to cause the sheet to physically deform. The transfer of this mechanical response from a surface of the sheet to fluid within an adjacent chamber results in the fluid becoming displaced and pressurized, which causes one or more droplets of fluid being ejected. The electric field is induced within the sheet by applying a voltage across electrodes disposed on the flexible sheet.

Conventionally, the electrodes are arranged in an opposing manner on the sheet. A first electrode is connected to a top surface of the sheet, and a bottom electrode is connected to a bottom surface of the sheet. This arrangement of the electrodes provides for a relatively large mechanical response from the sheet for a given voltage applied between the electrodes. However, fabricating a fluid-ejection device having the electrodes arranged in such an opposing manner on the sheet means that reliable electrical connection to the electrodes have to be made, which is relatively difficult to achieve, resulting in higher fabrication costs.

Therefore, one lower cost approach to arranging the electrodes on the sheet that has been tried is to position both electrodes onto the same surface of the sheet, such as in an interdigitated manner to result in what are referred to as interdigitated electrodes. Making electrical connections to both electrodes in a fluid-ejection device having the electrodes arranged on the same surface of the sheet is more easily achieved, and thus results in lower fabrication costs. However, such an arrangement of the electrodes provides for a smaller mechanical response to be induced within the sheet for a given voltage applied between the electrodes. Another advantage of interdigitated electrodes occurs when the piezoelectric material is a piezoceramic thin film. In this case, the absence of an electrode on one surface of the piezoceramic film permits a wider range of seed materials to be used that align the crystalline structure during growth of the thin film. Nevertheless, currently the adoption of interdigitated electrodes has been hindered by the relatively low mechanical response that results when using such interdigitated electrodes.

The inventors have developed an approach by which the electrodes can be arranged within the same surface of the sheet, while still achieving nearly the same performance as when the electrodes are arranged in an opposing manner on the sheet. In the inventive approach, rather than placing the interdigitated electrodes on the same surface of the sheet, the interdigitated electrodes extend within the piezoceramic sheet from a first surface of the sheet, such as the bottom surface, towards a second surface of the sheet opposite the first surface, such as the top surface. The interdigitated electrodes have side surfaces that are at least substantially perpendicular to a substrate, such as a diaphragm, on which the piezoceramic sheet is located.

The inventors have found that having the electrodes within the piezoceramic sheet still provides for easier electrical connections to be made as well as for higher reliability in making such electrical connections, as compared to arranging the electrodes on opposite sides of the sheet. Having the electrodes within the same surface of the sheet provides for nearly the same or even greater mechanical response to be induced within the sheet, as compared to arranging the electrodes on opposite sides of the sheet. That the side surfaces of the interdigitated electrodes are at least substantially perpendicular to the substrate on which the piezoceramic sheet is located provides for a more optimal electric field induced within the sheet when applying a voltage between the electrodes.

In particular, the electric field is induced within the plane of the piezoceramic sheet from the first surface of the sheet to at least substantially the second surface of the sheet opposite the first surface. That is, the magnitude and direction of the electric field are spatially uniform throughout the sheet. This is because the electrodes extend from the first surface of the sheet to at least substantially the second surface of the sheet. Furthermore, the direction of the electric field is primarily parallel to the plane of the piezoceramic sheet, and is minimally perpendicular to the plane of the sheet. This is because the electrodes are at least substantially perpendicular to the substrate on which the piezoceramic sheet is located.

FIG. 1 shows an example cross-sectional side view of a piezoelectric fluid-ejection assembly 100 of a unimorph type. The assembly 100 includes a rigid orifice plate 102 having an outlet 104 through which droplets of fluid are ejected. The assembly 100 further includes a flexible diaphragm 106 having an inlet 108 to receive the fluid that is ultimately ejected as droplets through the outlet 104. The assembly 100 also includes a number of rigid sidewalls 110A and 110B, collectively referred to as the sidewalls 110, which separate the orifice plate 102 from the diaphragm 106. The diaphragm 106 is more generally a substrate.

A fluid chamber 112 of the assembly 100 is defined by the orifice plate 102, the diaphragm 106, and the sidewalls 110 to contain the fluid received through the inlet 108 prior to ejection of droplets of the fluid through the outlet 104. A piezoelectric actuator 114 is disposed along the diaphragm 106 opposite the fluid chamber 112. Inducing an electric field within the actuator 114 causes the actuator 114 to physically deform, which results in the diaphragm 106 and the actuator 114 to bend into the chamber 112, which in turn reduces the size of the fluid chamber 112 and thus causes droplets of the fluid to be ejected through the outlet 104. Subsequent removal of the electric field then permits the actuator 114 to relax, which returns the diaphragm 106 and actuator 114 to the unbent state.

An x-axis 116, a y-axis 118, and a z-axis 120 are depicted in FIG. 1. The x-axis 116 is parallel to the length of the piezoelectric actuator 114, from left to right in FIG. 1. The y-axis 118 is parallel to the width of the actuator 114, into the plane of FIG. 1. The z-axis 120 is parallel to the height of the actuator 114, from bottom to top in FIG. 1. Physical deformation of the actuator 114 responsive to inducing an electric field within the actuator 114 can cause the actuator 114 to contract along the x-axis 116 and along the z-axis 120, and to expand along the y-axis 118.

In FIG. 1, the flexible diaphragm 106 includes notches 122A and 122B, collectively referred to as the notches 122, which are positioned to either side of the piezoelectric actuator 114. The notches 122 permit the diaphragm 106 to contract or expand more readily along the x-axis 116. Such increased movement of the diaphragm 106 along the x-axis reduces clamping on the actuator 114 along the x-axis 116. As depicted in FIG. 1, the notches 122 do not penetrate completely through the diaphragm 106. However, as another example, the notches 122 do penetrate completely through the diaphragm 106, in which case the notches 122 may be sealed with a flexible sealant or a polymer film covering.

Figure 2:
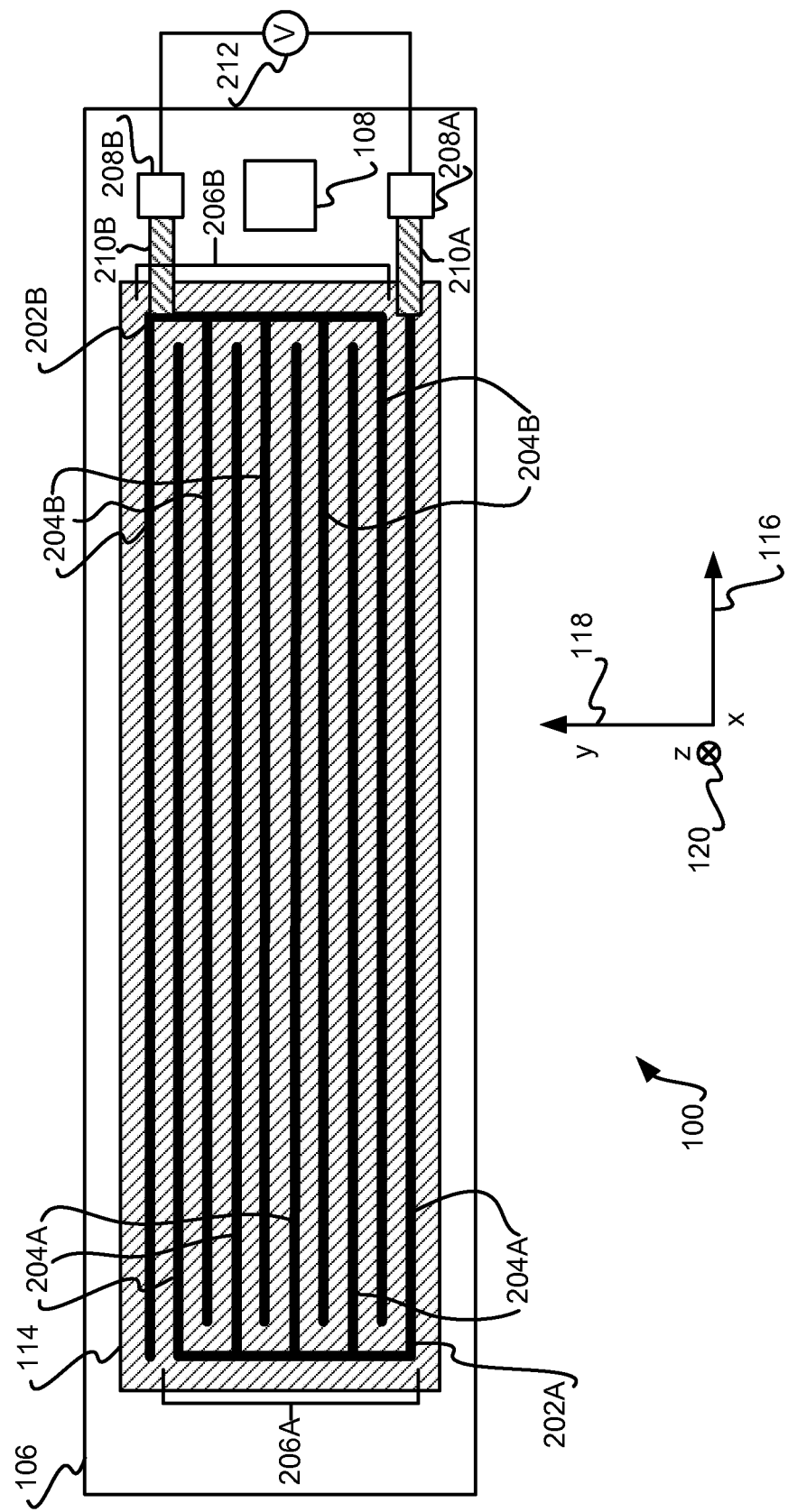
FIG. 2 is a diagram of an example bottom view of a piezoelectric fluid-ejection assembly.

FIG. 2 shows an example bottom view of the piezoelectric fluid-ejection assembly 100. The flexible diaphragm 106, the inlet 108, and the piezoelectric actuator 114 are particularly depicted in FIG. 2. The actuator 114 includes interdigitated electrodes 202A and 202B, which are collectively referred to as the electrodes 202. The electrodes 202 are embedded within the actuator 114. Application of a voltage between the electrodes 202 induces an electric field within the actuator 114, which causes the actuator 114 to physically deform.

The piezoelectric actuator 114 has a length parallel to the x-axis 116 and a width parallel to the y-axis 118. The electrode 202A has a number of fingers 204A extending along the length of the actuator 114, and a bar 206A extending along the width of the actuator 114 that electrically connects the fingers 204A together. Likewise, the electrode 202B has a number of fingers 204B, as well as a bar 206B that electrically connects the fingers 204B together. The fingers 204A and 204B are collectively referred to as the fingers 204, and the bars 206A and 206B are collectively referred to as the bars 206. The bars 206 of the electrodes 202 are disposed at opposite sides of the actuator 114. The fingers 204B of the electrode 202B are interleaved in relation to the fingers 204A of the electrode 202A, and vice-versa. In this sense, the electrode 202B is said to be interdigitated in relation to the electrode 202A, and vice-versa. The fingers 202 can be equally spaced in relation to one another, to achieve identical electrical field distributions in the regions between the fingers 202, ensuring uniform deformation of the actuator 114.

Also depicted in FIG. 2 are contact pads 208A and 208B, collectively referred to as the contact pads 208, and conductive traces 210A and 210B, collectively referred to as the conductive traces 210. The conductive trace 210A electrically connects the contact pad 208A to the electrode 202A, whereas the conductive trace 210B electrically connects the contact pad 208B to the electrode 202B. A voltage source 212 is electrically connected to the contact pads 208 to provide a voltage to the electrodes 202, and thus to induce an electric field within the piezoelectric actuator 114.

It is also noted that the plane defined by the x-axis 116 and the y-axis 118 is parallel to the surface of the diaphragm 106 (i.e., the substrate). As can be seen in FIG. 2, the material in-between the electrodes 202 and 204, which is a thin film sheet, occupies more of this plane than the electrodes 202 and 204 do. In one example, the ratio of the width of the thin film sheet to the width of the electrodes 202 and 204 within the plane is ten-to-one.

Figure 3:
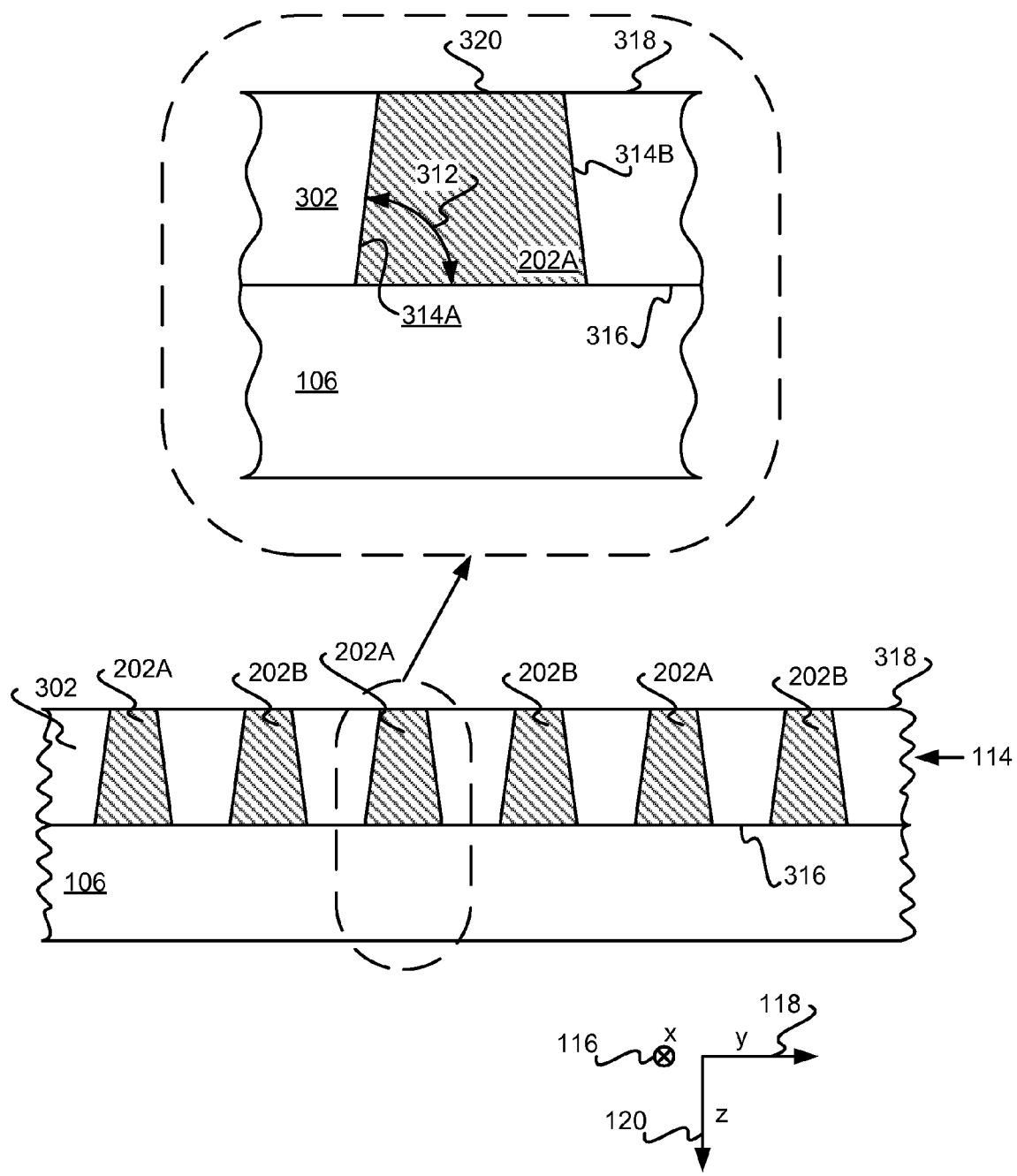
FIG. 3 is a diagram of an example cross-sectional front view of an actuator of a piezoelectric fluid-ejection assembly in detail.

FIG. 3 shows an example cross-sectional front view of the piezoelectric actuator 114 in detail. Furthermore, a portion of the actuator 114 that is encircled by a dotted line is shown in even more detail in FIG. 3. The x-axis 116 extends into the plane of FIG. 3, and the y-axis 118 extends left to right in FIG. 3. The z-axis 120 extends from top to bottom in FIG. 3; it is noted in this respect that the z-axis 120 in FIG. 3 differs from that of FIG. 1, in which the z-axis 120 extends from bottom to top. The actuator 114 includes a thin film sheet 302 within which the electrodes 202A and 202B have been formed. As one example, the thin film sheet 302 is a thin film in that it has a thickness of no greater than ten microns, and, as another example, the sheet 302 is a thin film in that it has a thickness of no greater than five microns. The thin film sheet 302 includes surfaces 316 and 318 that are opposite to one another.

The electrodes 202 are exemplarily described in relation to the electrode 202A that encircled by a dotted line in FIG. 3. The electrode 202A extends from the surface 316 to the surface 318 in the example of FIG. 3. More generally, however, the electrode 202A extends from the surface 316 towards the surface 318. That is, as another example, the electrode 202A does not reach the surface 318, such that the top surface 320 of the electrode 202A is below the surface 318.

The electrode 202A includes side surfaces 314A and 314B, collectively referred to as the side surfaces 314. The side surfaces 314 are described in example relation to the side surface 314A. The side surface 314A is at least substantially perpendicular to the diaphragm 106, which as noted above is more generally a substrate. At least substantially perpendicular generally means herein that the side surface 314A is at an angle 312 from the diaphragm 106 that is between seventy and one hundred-five degrees, and more specifically that the side surface 314A is at an angle 312 from the diaphragm 106 that is between eighty and eighty-five degrees. It is noted that any waviness of the side surface 314A does not affect the overall direction of the surface 314A.

It has been found that arranging the electrodes 202 as in FIG. 3 is advantageous. Specifically, this arrangement provides for a more optimal electric field within the thin film sheet 302 when a voltage is applied between the electrodes 202. First, the electric field is optimally induced within the x-y plane of the thin film sheet 302 throughout the height of the sheet 302 defined between the surface 316 and the surface 318. This is because the electrodes 202 extend from the surface 316 to the surface 318 in FIG. 3. Second, the direction of the electric field is optimally primarily parallel to the x-y plane, and is minimally perpendicular to the x-y plane. This is because the electrodes 202 have side surfaces that are at least substantially perpendicular to the x-y plane.

Figure 4:
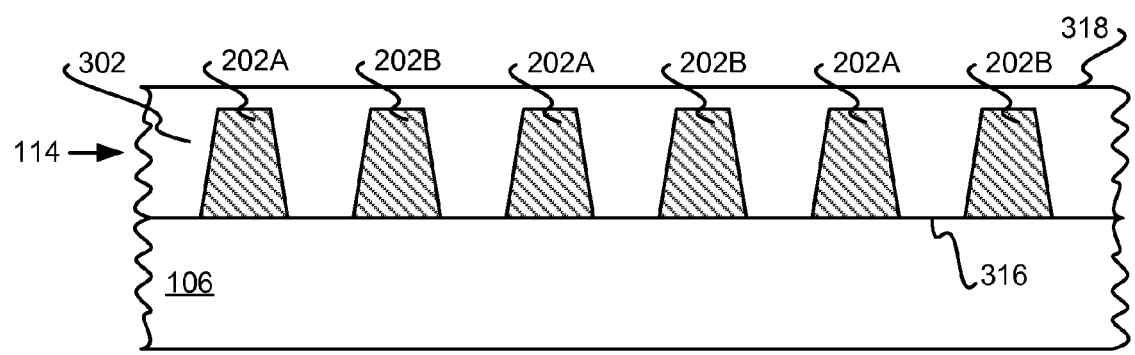
FIG. 4 is a diagram of another example cross-sectional front view of a portion of an actuator of a piezoelectric fluid-ejection assembly in detail.

FIG. 4 shows another example cross-sectional front view of a portion of the piezoelectric actuator 114 in detail. In FIG. 4, the side surfaces of the electrodes 202 are at least substantially perpendicular to the diaphragm 106, as in FIG. 3. However, in FIG. 4, the electrodes 202 extend from the surface 316 of the thin film sheet 302 towards the surface 318 of the thin film sheet 318, but not to the surface 318. That is, the electrodes 202 in FIG. 4 do not reach the surface 318. This is different than the example of FIG. 3, in which the electrodes 202 extend to the surface 318 of the thin film sheet 318, and thus reach the surface 318.

Figure 5:
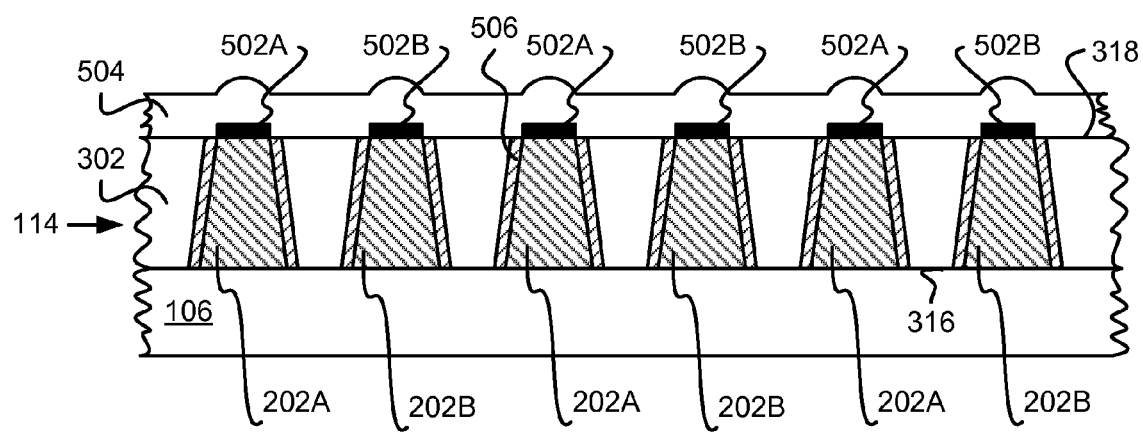
FIG. 5 is a diagram of an example cross-sectional front view of a portion of an actuator of a piezoelectric fluid-ejection assembly in more complete detail than in FIGS. 3 and 4.

FIG. 5 shows an example cross-sectional front view of a portion of the piezoelectric actuator 114 in more complete detail than in FIGS. 3 and 4. In FIG. 5, the side surfaces of the electrodes 202 are at least substantially perpendicular to the diaphragm 106, as in FIGS. 3 and 4. The electrodes 202 are exemplarily depicted in FIG. 5 as extending from the surface 316 of the thin film sheet 302 to the surface 318 of the sheet 302 as in FIG. 3, but may alternatively extend from the surface 316 towards but not to the surface 318 as in FIG. 4.

A metallic layer 506 can be formed on the electrodes 202, such as on the side surfaces of the electrodes 202 as depicted in FIG. 5. The metallic layer 506 may be platinum, or another metal. The metallic layer 506 serves to protect the electrodes 202 when the thin film sheet 302 is formed between the electrodes 202. For example, the electrodes 202 may be formed from nickel, which is potentially susceptible to chemical interaction with the material that forms the thin film sheet 302 during formation of the thin film sheet 302. More generally, the metallic layer 506 is a conductive layer, and therefore can be a non-metallic layer as well, so long as it is a conductive non-metallic layer.

Surface electrodes 502A and 502B, collectively referred to as the surface electrodes 502, are formed on the top surfaces of the electrodes 202 in FIG. 5. The surface electrodes 502 aid in connecting the electrodes 202 to the voltage source 212 of FIG. 2. In particular, the surface electrodes 502 are more easily connected to the conductive traces 210 of FIG. 2 than the electrodes 202 themselves are, or the metallic layer 506 is.

It is noted that the electrodes 202 can be a conductive material, such as nickel, or in one example, from a non-conductive material, in which the electrodes 202 are considered to be a dielectric. In this example, the electrodes 202 can be non-conductive where the metallic layer 506, which is more generally a conductive layer, is present, because the layer 506 is itself conductive. That is, where the layer 506 is present on the electrodes 202, the electrodes 202 themselves do not have to be conductive because the layer 506 is conductive. The surface electrodes 502 are conductive as well. However, if the electrodes 202 are not conductive, then the surface electrodes 502 have to be in contact with the layer 502, however.

A dielectric seal 504 is formed on the thin film sheet 302 in FIG. 5. The dielectric seal 504 protects the thin film sheet 302 from moisture and from the fluid to which the sheet 302 might be exposed within the fluid-ejection assembly 100 of FIG. 1. The dielectric seal 504 is a dielectric seal in that it is fabricated from an electrically insulative material that prevents electrical shorting between the electrodes 202 that can result from electrolysis or chemical interactions. Examples of such a material include zirconium oxide, tantalum oxide, and aluminum oxide.

In the specific example of FIG. 5, the surface electrodes 502 are completely located within the dielectric seal 504, on the surface 318 of the thin film sheet 302. However, where the electrodes 202 do not extend to the surface 318 of the thin film sheet 302, such as is depicted in FIG. 4, the surface electrodes 502 are instead at least partially located within the thin film sheet 302 itself. For example, the surface electrodes 502 may be completed located within the thin film sheet 302. Alternatively, the surface electrodes 502 may be partially located within the thin film sheet 302, and partially located within the dielectric seal 504.

Figure 6:
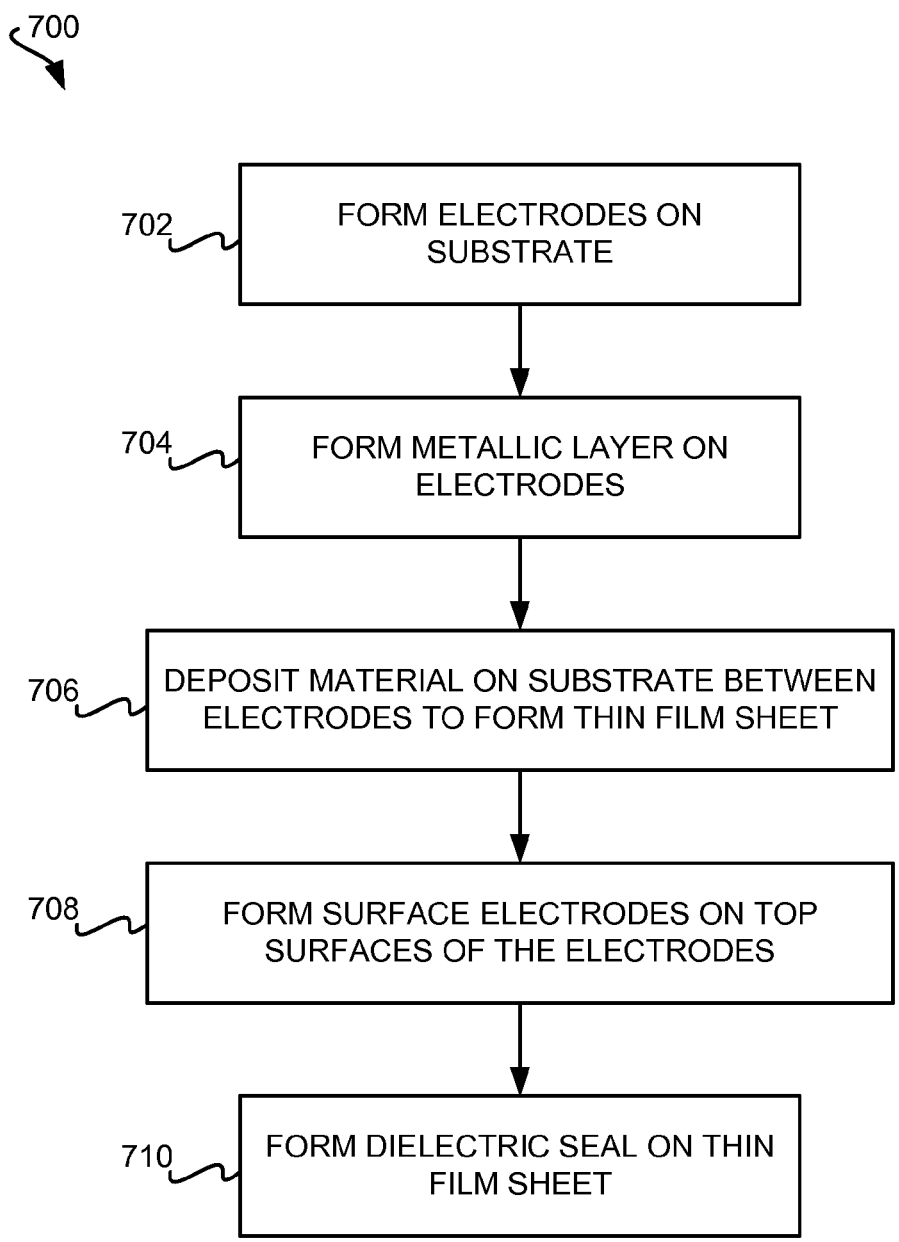
FIG. 6 is a flowchart of an example method for fabricating an actuator of a piezoelectric fluid-ejection assembly.

FIG. 6 shows an example method 700 for fabricating the piezoelectric actuator 114. The electrodes 202 are first formed on a substrate, such as the flexible diaphragm 106 (702). The electrodes 202 are at least substantially perpendicular to the substrate, as has been described. Two different approaches, specifically an additive approach and a subtractive approach, by which the electrodes 202 can be fabricated on the substrate are described later in the detailed description.

The metallic layer 506 can be formed on the electrodes 202 (704). The metallic layer is not formed on the substrate exposed between the electrodes 202. The metallic layer can be platinum, as one example. The metallic layer serves to protect the electrodes 202 during subsequent fabrication of the piezoelectric actuator 114 and as a seed layer for orienting the formation of the piezoelectric structure. One approach by which the metallic layer can be formed is described later in the detailed description. Furthermore, as noted above, the metallic layer 506 is more generally a conductive layer.

Piezoelectric material is deposited on the substrate at least between the electrodes to form the thin film sheet 302 (706). The material can be a piezoceramic material, as one example. Other examples include lead zirconium titanate and lead lanthanum zirconium titanate. The material is selected such that the resultant thin film sheet 302 can physically deform responsive to an electric field induced within the thin film sheet 302 via application of a voltage across the electrodes 202. Different approaches by which the material can be deposited to form the thin film sheet 302 are described later in the detailed description.

The surface electrodes 502 are formed at least partially on the top surfaces of the electrodes 202 (708). The surface electrodes 502 can be the same or different material as the electrodes 202 and/or the metallic layer on the electrodes, such as nickel, platinum, gold, copper, and so on. One approach by which the surface electrodes 502 can be formed is described later in the detailed description.

The dielectric seal 504 is then formed on the thin film sheet 302 (710). As noted above, examples of the dielectric seal include be zirconium oxide, tantalum oxide, and aluminum oxide. The dielectric seal can be formed by chemical vapor deposition (CVD), by another deposition technique other than chemical vapor deposition, or by another formation technique other than deposition. For instance, atomic layer deposition (ALD) can be used, which is a type of CVD.

It is noted that in the method 700, the electrodes 202 are formed on the substrate before the thin film sheet 302 is formed. This approach is advantageous, as it permits the electrodes 202 to be formed with a desired profile, specifically such that the electrodes 202 have side surfaces that are at least substantially perpendicular to the substrate. Once the electrodes 202 have been formed as desired, the thin film sheet 302 is formed between adjacent electrodes 202. Ultimately then, the electrodes 202 advantageously extend from the surface 316 of the thin film sheet 302 towards the surface 318 of the sheet 302, as has been described.

Figure 7:
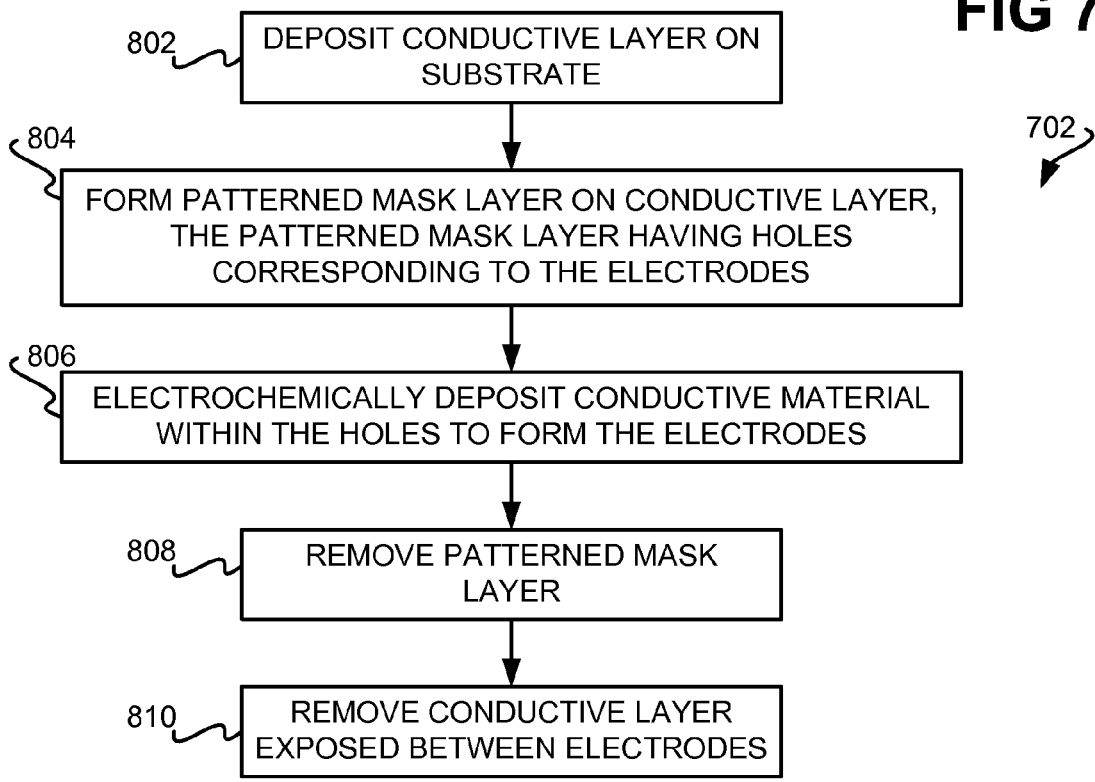
FIG. 7 is a flowchart of an example additive method for forming electrodes of a piezoelectric actuator.

FIG. 7 shows an example method by which the electrodes 202 can be additively formed on the substrate in part 702 of the method 700. A conductive layer is deposited on the substrate (802). The conductive layer acts as a seed layer to promote subsequent formation of the electrodes 202. A patterned mask layer is formed on the conductive layer (804). The patterned mask layer has holes that correspond to the desired locations of the electrodes 202 on the substrate. A conductive material is electrochemically deposited within these holes to form the electrodes 202 (806). The conductive layer previously deposited in part 802 assists this electrochemical deposition process. The remaining patterned mask layer is then removed (808), and the conductive layer exposed between the electrodes 802 is also removed (810), such as by etching.

Figure 8A:
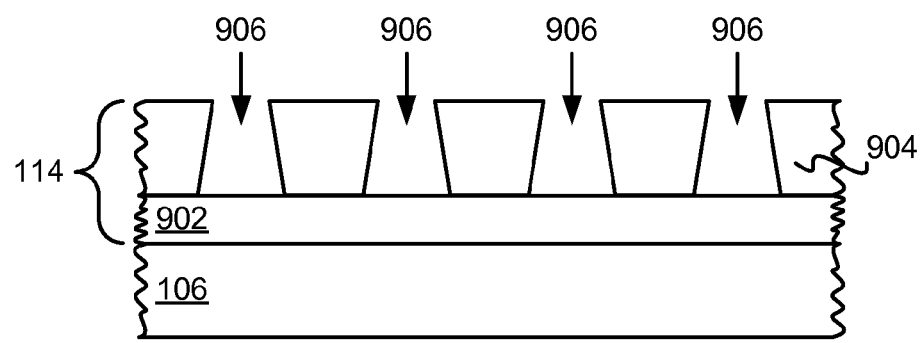
FIGS. 8A and 8B are diagrams depicting example performance of the method of FIG. 7.

FIG. 8A shows the piezoelectric actuator 114 being formed after parts 802 and 804 of the method of FIG. 7 have been exemplarily performed. A conductive layer 902, such as nickel, is deposited on the diaphragm 106. A patterned mask layer 904 is formed on the conductive layer 902. The patterned mask layer 904 has holes 906 corresponding to the desired locations of the electrodes 202 on the substrate. The patterned mask layer 904 may be photoresist that has been suitably exposed and developed using photolithographic techniques, or it may be another type of material. The patterned mask layer 904 has a height corresponding to the desired height of the electrodes 202 to be formed.

Figure 8B:
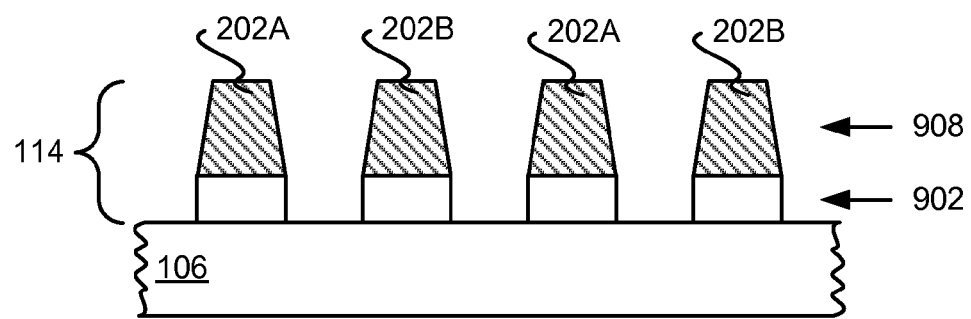

FIG. 8B shows the piezoelectric actuator 114 being formed after parts 802, 804, 806, 808, and 810 of the method of FIG. 7 have been exemplarily performed. Conductive material 908, such as nickel, has been deposited within the holes 906 of FIG. 8A of the patterned mask layer 904 of FIG. 8A, and then the patterned mask layer 904 has been removed. The conductive material 908 is electrochemically deposited. The electrodes 202 are thus formed from the conductive material 908. Once the electrodes 202 have been formed, the conductive layer 902 exposed between the electrodes 202 is removed, as depicted in FIG. 8B.

Figure 9:
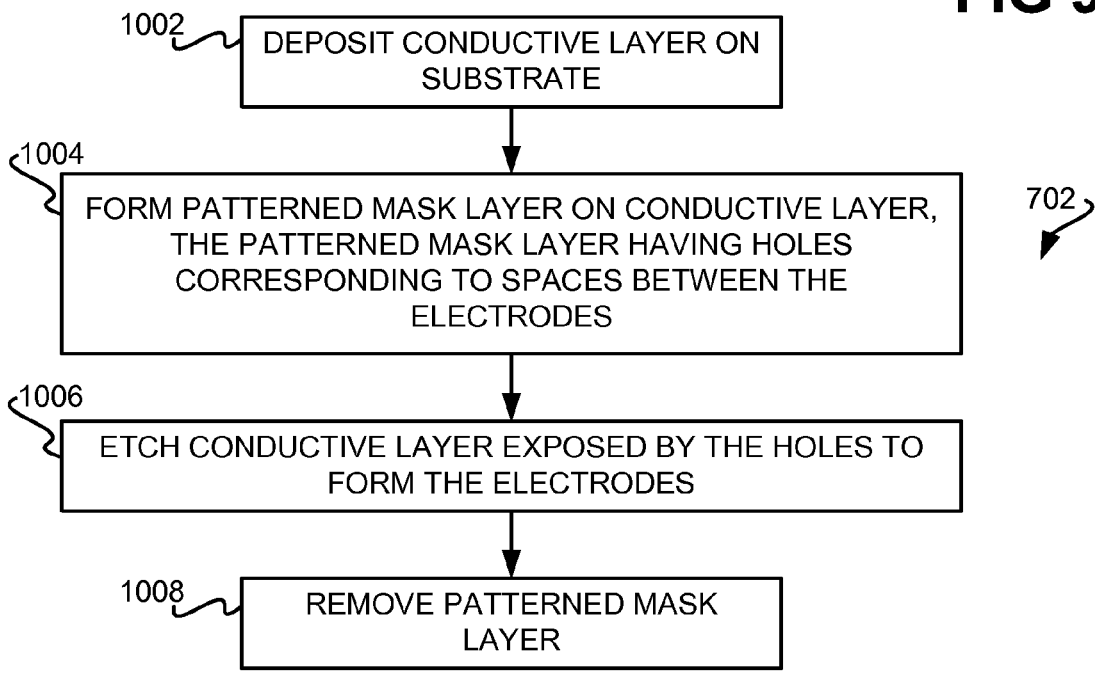
FIG. 9 is a flowchart of an example subtractive method for forming electrodes of a piezoelectric actuator.

FIG. 9 shows an example method by which the electrodes 202 can be subtractively formed on the substrate in part 702 of the method 700. A conductive layer is deposited on the substrate (1002). A patterned mask layer is formed on the conductive layer (1004). The patterned mask layer has holes that correspond to the desired spaces on the substrate between the electrodes 202. The conductive layer where exposed by the holes is etched to form the electrodes 202 (1006). The remaining patterned mask layer is then removed (1008).

Figure 10A:
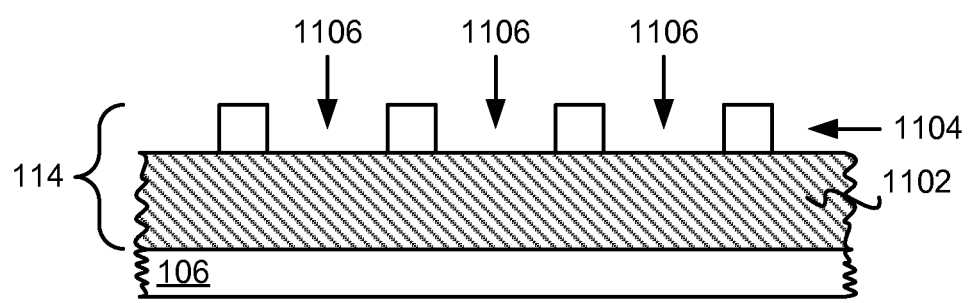
FIGS. 10A and 10B are diagrams depicting example performance of the method of FIG. 9.

FIG. 10A shows the piezoelectric actuator 114 being formed after parts 1002 and 1004 of the method of FIG. 9 have exemplarily been performed. A conductive layer 1102, such as nickel, a nickel-vanadium alloy, platinum, iridium, ruthenium, or another conductive material, is deposited on the diaphragm 106. It is noted that where the conductive layer 1102 is present, the conductive layer 506 that has been previously described does not have to be present.

The conductive layer 1102 has a height corresponding to the desired height of the electrodes 202 to be formed. A patterned mask layer 1104 is formed on the conductive layer 1102. The patterned mask layer 1104 has holes 1106 corresponding to the desired spaces on the diaphragm 106 between the electrodes 202 to be formed. The holes 1106 have widths and positions corresponding to the spaces between the top surfaces of the electrodes 202 to be formed. Stated another way, the patterned mask layer 1104 remains in width and in position in correspondence with the top surfaces of the electrodes 202 to be formed. The patterned mask layer 1104 may be photoresist that has been suitably exposed and developed using photolithographic techniques, or it may be another type of material, such as silicon nitride.

Figure 10B:
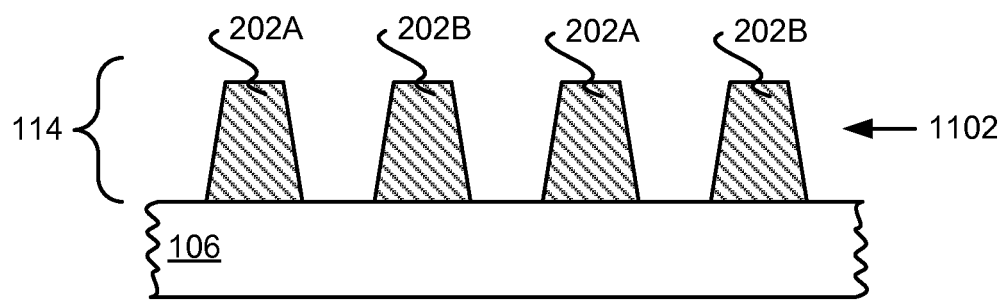

FIG. 10B shows the piezoelectric actuator 114 being formed after parts 1002, 1004, 1006, and 1008 of the method of FIG. 9 have been exemplarily performed. The conductive layer 1102 exposed by the holes 1106 of the patterned mask layer 1104 has been etched, and then the patterned mask layer 1104 has been removed. The conductive layer 1102 that remains forms the electrodes 202. The etching can result in more of the conductive layer 1102 being etched closer to the patterned mask layer 1104 as compared to farther from the patterned mask layer 1104. As such, the electrodes 202 may have side surfaces that are not exactly perpendicular to the diaphragm 106.

The difference between methods of FIGS. 7 and 9 to form the electrodes 202 is that the method of FIG. 7 is additive, and the method of FIG. 9 is subtractive. In the additive method, the conductive material 908 is deposited, or added, just where the electrodes 202 are to be formed, and no conductive material 908 is removed from the diaphragm 106. By comparison, in the subtractive method, the conductive layer 1102 is deposited over the entire diaphragm 106, and is removed, or subtracted, so that the conductive layer 1102 that remains forms the electrodes 202.

FIG. 11 shows an example method by which the metallic layer 506 can be formed on the electrodes 202 in part 704 of the method 700 of FIG. 6. The metallic layer 506 is deposited on and between the electrodes 202 (1202), such as on the substrate exposed between the electrodes 202. A patterned mask layer is formed on the metallic layer 506 (1204). The patterned mask layer has holes that correspond at least to the spaces between the electrodes 202. The patterned mask layer may further have holes that correspond to the top surfaces of the electrodes 202. The metallic layer 506 is removed where the metallic layer 506 is exposed through the holes within the patterned mask layer (1206). The remaining patterned mask layer is then removed (1208). As noted above, the metallic layer 506 is more generally a conductive layer.

Figure 12A:
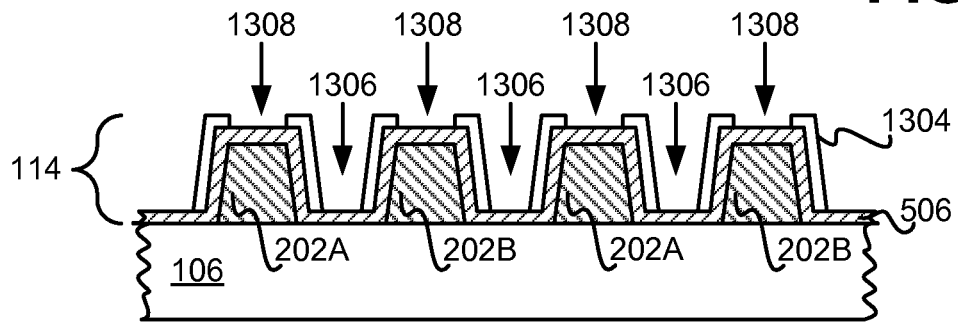
FIGS. 12A and 12B are diagrams depicting example performance of the method of FIG. 11.

FIG. 12A shows the piezoelectric actuator 114 being formed after parts 1202 and 1204 of the method of FIG. 11 have been exemplarily performed. The metallic layer 506 is deposited over and between the electrodes 202. As noted above, the metallic layer 506 may be platinum, or another metal, and is more generally a conductive layer. A patterned mask layer 1304 is formed on the metallic layer 506. The patterned mask layer 1304 has holes 1306 corresponding to the spaces between the electrodes 202, and has holes 1308 corresponding to the top surfaces of the electrodes 202. The patterned mask layer 1304 may be photoresist that has been suitably exposed and developed using photolithographic techniques, or it may be another type of material, such as silicon nitride.

Figure 12B:
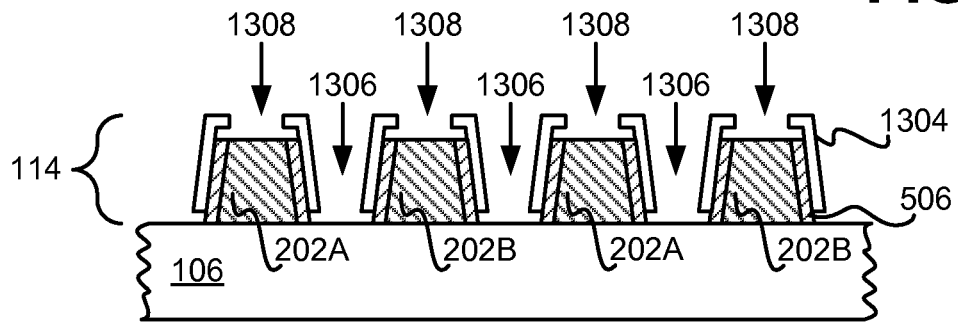
Figure 12C:
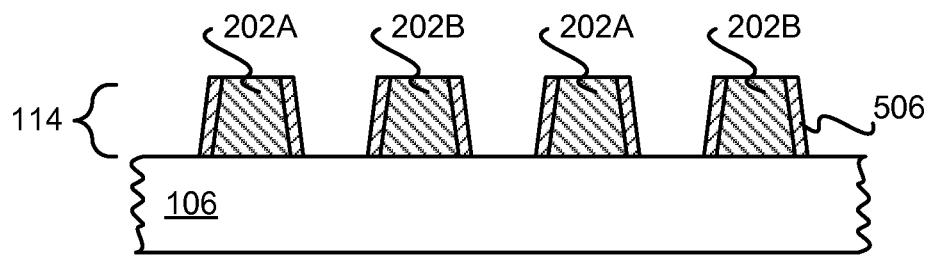

FIG. 12B shows the piezoelectric actuator 114 being formed after parts 1202, 1204, and 1206 of the method of FIG. 11 have been exemplarily performed. The metallic layer 506 exposed through the holes 1306 and 1308 of the patterned mask layer 1304 has been removed. It is noted that some of the metallic layer 506 under the ends of the patterned mask layer 1304 has also been removed in FIG. 12B, as a result of undercutting occurring during removal of the metallic layer 506.

FIG. 13C shows the piezoelectric actuator 114 being formed after parts 1202, 1204, 1206, and 1208 of the method of FIG. 11 have been performed. The metallic layer 506 has been removed where the metallic layer 506 is exposed through the mask layer 1304, and the mask layer 1304 has been removed. The result is that the metallic layer 506 remains on at least the side surfaces of the electrodes 202, since it is protected by the patterned mask layer 1304 when the unprotected portions of the metallic layer 506 are removed.

FIG. 13 shows an example method by which the thin film sheet 302 can be formed in part 706 of the method 700 of FIG. 6. An electric field may be induced between the electrodes 202 (1402). The electric field is induced between the electrodes 202 by applying a voltage between the electrode 202A and the electrode 202B. A material from which the thin film sheet 302 is to be formed is deposited between adjacent electrodes 202 (1404), and can also be deposited on the electrodes 202. Such deposition can be achieved in a number of different ways.

For example, the material may be sputtered at high temperature, such as 500-700° C., which promotes mobility of ions of the material to form a thin film sheet 302 with a suitably oriented internal structure (1406). As another example, the material may be sputtered at low temperature, such as 25-200° C., and then annealed or sintered to promote mobility of the ions of the material to form a thin film sheet 302 with a suitably oriented internal structure (1408). As a third example, the material may be sputtered at an intermediate temperature, such as 200-500° C., and then annealed or sintered to promote mobility of the ions of the material to form a thin film sheet 302 with a suitably oriented internal structure (1410). Annealing or sintering may be accomplished within an oven, and/or via rapid thermal processing (RTP), such as at a temperature between 500-1000° C., and desirably between 650-700° C.

It is noted that the temperature ranges described in the previous paragraph are examples, and in other examples, higher or lower temperatures may be able to be employed. Furthermore, techniques other than sputtering may be used to form the thin film sheet 302 between the electrodes 202. Such other techniques include aerosol deposition, screen printing, metal-organic chemical vapor deposition, pulsed-laser deposition, and atomic layer deposition. Still other techniques include using a laser treatment to provide localized heating without heating the substrate itself.

The electric field may be induced between the electrodes 202 after the material has been deposited, but before the material is annealed or sintered, such that the material is annealed or sintered while the electric field is being induced. As another example, the electric field may be induced between the electrodes 202 before the material is deposited, such that the material is also deposited while the electric field is being induced.

The presence of a voltage difference between the electrodes has been found to provide for better formation of the thin film sheet 302 between the electrodes 202. Specifically, the electric field induced in the thin film sheet 302 promotes the alignment of internal dipoles within the thin film sheet 302 during formation of the sheet 302. Specifically, the electric field promotes polarization within the thin film sheet 302 along the y-axis 118 between adjacent electrodes 202 (i.e., at least substantially perpendicular to side surfaces of the electrodes 202). As the thin film sheet 302 cools down below its Curie temperature, the domains of the sheet 302 become better aligned (i.e., polarized). As a result, the piezoelectric efficiency of the thin film sheet 302 is greater. The electric field is therefore not removed until the thin film sheet 302 has sufficiently cooled so that incomplete polarization of the sheet 302 does not result.

Therefore, inducing an electric field between the electrodes 202 during formation of the thin film sheet helps ensure that the sheet 302 is globally polarized between the electrodes 202 along the y-axis 118 of FIG. 3. Locally individual domains of the material may by oriented in different and varying directions, but the average of these orientations over the thin film sheet 302 as a whole is along the y-axis 118. Polarization along the y-axis 118 is advantageous, because it provides for a larger $d_{33}$ piezoelectric response from the thin film sheet 302 responsive to a given electric field along the y-axis 118 than if the thin film sheet 302 were not so polarized. Stated another way, such polarization provides for a desired piezoelectric response from the thin film sheet 302 responsive to a lower electric field than if the thin film sheet 302 were not polarized along the y-axis 118.

Inducement of an electric field during fabrication of the piezoelectric actuator 114 is not be confused with inducement of the electric field during usage of the actuator 114 after fabrication. In the former, the electric field is induced so that deposition of the material from which the thin film sheet 302 is formed occurs in such a way that polarization of this material is optimized. In the latter, the electric field is induced to cause the thin film sheet 302 to physically deform to, for instance, cause fluid droplets to be ejected from the fluid-ejection assembly 100 including the piezoelectric actuator 114.

Figure 14:
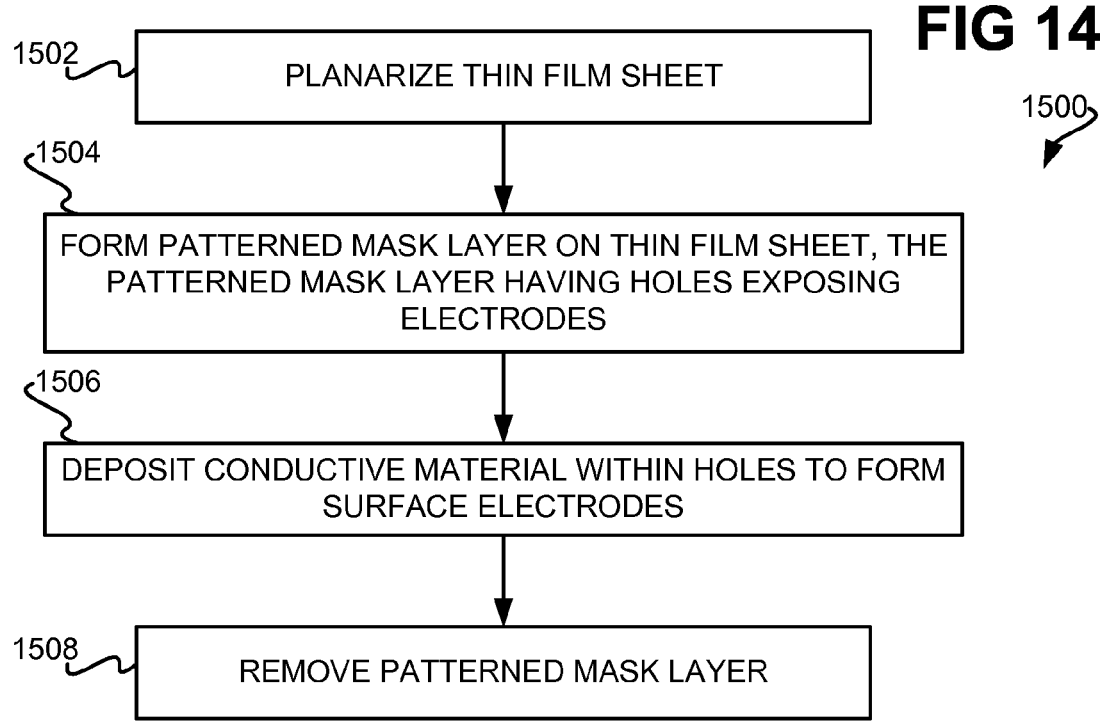
FIG. 14 is a flowchart of an example method for forming surface electrodes on electrodes of a piezoelectric actuator.

FIG. 14 shows an example method by which the surface electrodes 502 can be formed on the electrodes 202 in part 708 of the method 700 of FIG. 6. The thin film sheet 302 is planarized (1502), such as by chemical-mechanical planarization, to expose the electrodes 202 where they may have been covered by the material deposited in part 706 of the method 700 when forming the thin film sheet 302. A patterned mask layer is formed on the thin film sheet 302 (1504). The patterned mask layer has holes that expose the top surfaces of the electrodes 202. A conductive material is deposited within the holes of the patterned mask layer to form the surface electrodes 502 (1506). The conductive material may be nickel. The patterned mask layer is then removed (1508).

Figure 15A:
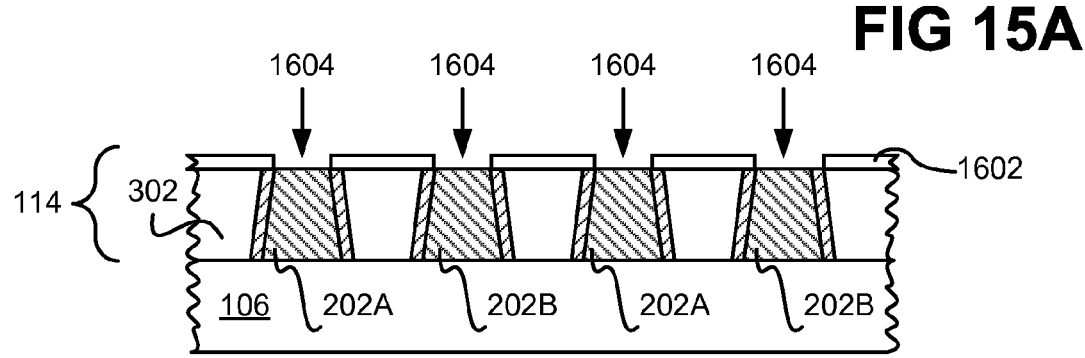
FIGS. 15A and 15B are diagrams depicting example performance of the method of FIG. 14.

FIG. 15A shows the piezoelectric actuator 114 being formed after parts 1502 and 1504 of the method of FIG. 14 have been exemplarily performed. The thin film sheet 302 is planarized, and a patterned mask layer 1602 is formed on the thin film sheet 302. The patterned mask layer 1602 has holes 1604 that expose the top surfaces of the electrodes 202. The patterned mask layer 1602 may be photoresist that has been suitably exposed and developed using photolithographic techniques, or it may be another type of material.

Figure 15B:
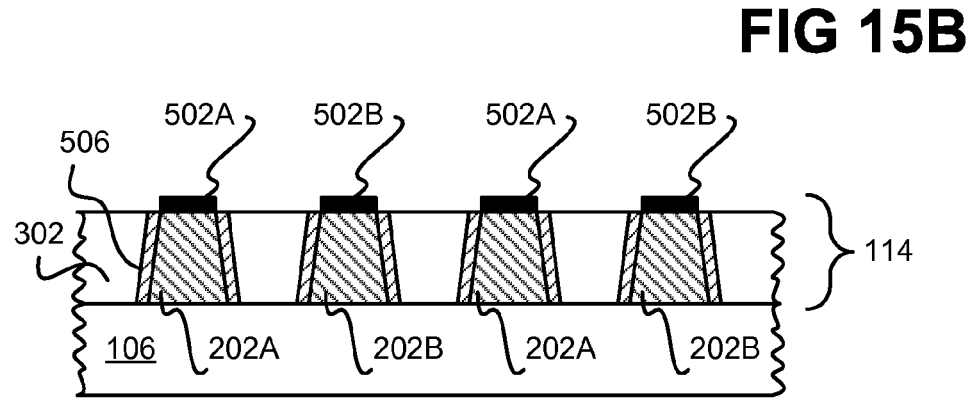

FIG. 15B shows the piezoelectric actuator 114 being formed after parts 1502, 1504, 1506, and 1508 have been exemplarily performed. Conductive material has been deposited within the holes 1604 of the patterned mask layer 1602, and thereafter the patterned mask layer 1602 is removed. The conductive material deposited within the holes 1604 and that remains on the top surfaces of the electrodes 202 forms the surface electrodes 502.

Figure 16:
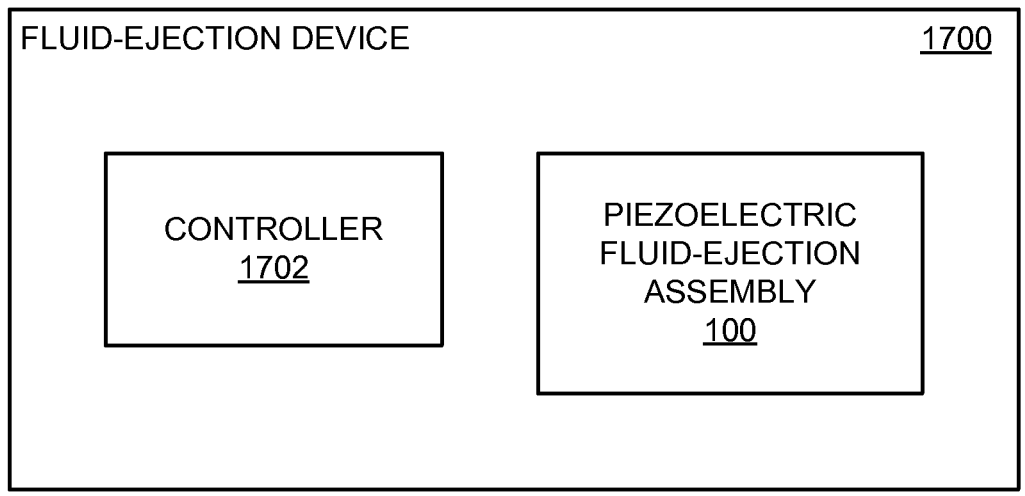
FIG. 16 is a block diagram of an example representative fluid-ejection device.

FIG. 16 shows a block diagram of a rudimentary example fluid-ejection device 1700. The fluid-ejection device 1700 includes a controller 1702 and the piezoelectric fluid-ejection assembly 100. The controller 1702 may be implemented in hardware, or a combination of machine-readable instructions and hardware, and controls ejection of droplets of fluid from the device 1700 in a desired manner by the fluid-ejection assembly 100.

It is noted that the fluid-ejection device 1700 may be an inkjet-printing device, which is a device, such as a printer, that ejects ink onto media, such as paper, to form images, which can include text, on the media. The fluid-ejection device 1700 is more generally a fluid-ejection, precision-dispensing device that precisely dispenses fluid, such as ink, melted wax, or polymers. The fluid-ejection device 1700 may eject pigment-based ink, dye-based ink, another type of ink, or another type of fluid. Examples of other types of fluid include those having water-based or aqueous solvents, as well as those having non-water-based or non-aqueous solvents. However, any type of fluid-ejection, precision-dispensing device that dispenses a substantially liquid fluid may be used.

A fluid-ejection precision-dispensing device is therefore a drop-on-demand device in which printing, or dispensing, of the substantially liquid fluid in question is achieved by precisely printing or dispensing in accurately specified locations, with or without making a particular image on that which is being printed or dispensed on. The fluid-ejection precision-dispensing device precisely prints or dispenses a substantially liquid fluid in that the latter is not substantially or primarily composed of gases such as air. Examples of such substantially liquid fluids include inks in the case of inkjet-printing devices. Other examples of substantially liquid fluids thus include drugs, cellular products, organisms, fuel, and so on, which are not substantially or primarily composed of gases such as air and other types of gases, as can be appreciated by those of ordinary skill within the art.

It is finally noted that while examples have been substantially described in relation to a piezoelectric actuator that is part of a piezoelectric fluid-ejection assembly of a fluid-ejection device, the piezoelectric actuator does not have to be part of a piezoelectric fluid-ejection assembly of a fluid ejection-device. For instance, the piezoelectric actuator that has been described may be part of a piezoelectric fluid-ejection assembly that is not part of a fluid-ejection device. Furthermore, the piezoelectric actuator that has been described may not even be part of a piezoelectric fluid-ejection assembly or part of a fluid-ejection device. Most generally, the piezoelectric actuator may be referred to as a piezoelectric mechanism, such as a piezoelectric bender, which physically deforms responsive to an electric field induced therein via application of a voltage over the electrodes embedded within the actuator. As such, a piezoelectric actuator as described herein is one type of piezoelectric mechanism. The piezoelectric mechanism can further include or be part of a sensor.

We claim:

1. A method for fabricating a piezoelectric mechanism comprising:
    forming first and second electrodes on a substrate, the second electrode interdigitated in relation to the first electrode, the first and the second electrodes having side surfaces at least substantially perpendicular to the substrate;
    depositing a material on the substrate and between the side surfaces of adjacent first and second electrodes to form a thin film sheet within which the first and the second electrodes extend from a first surface of the thin film sheet towards a second surface of the thin film sheet opposite the first surface,
    wherein the thin film sheet is to physically deform in response to an electric field induced within the thin film sheet via application of a voltage across the first and the second electrodes, and
    wherein the first and second electrodes are formed on the substrate and the material is deposited on the substrate to form the thin film sheet such that:
        along a given axis of the plane, the thin film sheet is polarized between and at least substantially perpendicular to side surfaces of the first and second electrodes, and
        along a plane parallel to a surface of the substrate on which the first and the second electrodes are formed and on which the material is deposited, the thin film sheet occupies more of the plane than the first and the second electrodes.

2. The method of claim 1, wherein the side surfaces of the first and the second electrodes are at an angle from the substrate that is between seventy and one hundred-five degrees.

3. The method of claim 2, wherein the angle at which the side surfaces of the first and the second electrodes are from the substrate is between eighty and eighty-five degrees.

4. The method of claim 1, further comprising, before depositing the material on the substrate and between the side surfaces of adjacent first and second electrodes to form the thin film sheet, forming a conductive layer on the first and the second electrodes, but not on the substrate exposed between the first and the second electrodes.

5. The method of claim 4, wherein forming the conductive layer comprises:
    depositing a conductive layer on the first and the second electrodes, and on the substrate exposed between the first and the second electrodes;
    forming a patterned mask layer on the conductive layer, the patterned mask layer having holes corresponding to at least spaces between the first and the second electrodes;
    removing the conductive layer on the substrate where the mask layer is exposed through the holes of the patterned mask layer, the conductive layer remaining at least on side surfaces of the first and the second electrodes due to the patterned mask layer protecting the conductive layer at least on the side surfaces of the first and the second electrodes; and,
    removing the patterned mask layer.

6. The method of claim 1, wherein depositing the material on the substrate to form the thin film sheet comprises depositing the material on the substrate to form the thin film sheet within which the first and the second electrodes extend from the first surface of the thin film sheet to the second surface of the thin film sheet.

7. The method of claim 1, further comprising forming surface electrodes at least partially on top surfaces of the first and the second electrodes, the surface electrodes to connect to voltage sources by which the application of the voltage across the first and the second electrodes is achieved.

8. The method of claim 7, wherein forming the surface electrodes at least partially on the top surfaces of the first and the second electrodes comprises:

planarizing the thin film sheet to expose the first and the second electrodes;

forming a patterned mask layer on the thin film sheet, the patterned mask layer having holes exposing the first and the second electrodes;

depositing a conductive material within the holes of the patterned mask layer; and, removing the patterned mask layer, such that the conductive material that remains forms the surface electrodes.

9. The method of claim 1, wherein forming the first and the second electrodes on the substrate comprises:

depositing a conductive layer on the substrate;

forming a patterned mask layer on the conductive layer, the patterned mask layer having holes corresponding to the first and the second electrodes;

electrochemically depositing a conductive material within the holes, such that the conductive material forms the first and the second electrodes; and, removing the patterned mask layer remaining over the conductive layer, wherein the conductive layer aids in electrochemical deposition of the conductive material within the holes.

10. The method of claim 1, wherein forming the first and the second electrodes on the substrate comprises:

depositing a conductive layer on the substrate;

forming a patterned mask layer on the conductive layer, the patterned mask layer having holes corresponding to spaces between the first and the second electrodes;

etching the conductive layer exposed by the holes of the patterned mask layer, such that the conductive layer that remains forms the first and the second electrodes; and, removing the patterned mask layer remaining over the conductive layer.

11. A method for forming a piezoelectric mechanism comprising:

forming first and second electrodes on a substrate, the second electrode interdigitated in relation to the first electrode, the first and the second electrodes having side surfaces at least substantially perpendicular to the substrate;

inducing a first electric field between the first and the second electrodes;

depositing a material on the substrate and between the side surfaces of adjacent first and second electrodes to form a thin film sheet within which the first and the second electrodes extend from a first surface of the thin film sheet towards a second surface of the thin film sheet opposite the first surface; and, annealing or sintering the material after the material has been deposited on the substrate, wherein one or more of the material is deposited on the substrate and the material is annealed or sintered, while the first electric field is being induced between the first and the second electrodes, and wherein the thin film sheet is to physically deform in response to a second electric field induced within the thin film sheet via application of a voltage across the first and the second electrodes.

12. A method for fabricating a piezoelectric mechanism comprising:

forming first and second electrodes on a substrate, the second electrode interdigitated in relation to the first electrode, and the first and second electrodes having side surfaces at least substantially perpendicular to the substrate;

depositing a material on the substrate and between the side surfaces of adjacent first and second electrodes to form a thin film sheet within which the first and the second electrodes extend from a first surface of the thin film sheet towards a second surface of the thin film sheet opposite the first surface, wherein the thin film sheet is to physically deform in response to an electric field induced within the thin film sheet via application of a voltage across the first and the second electrodes, and wherein the first and the second electrodes are formed on the substrate and the material is deposited on the substrate to form the thin film sheet such that, along a plane parallel to a surface of the substrate on which the first and the second electrodes are formed and on which the material is deposited, the thin film sheet occupies more of the plane than the first and the second electrodes.

13. The method of claim 12, further comprising:

forming a dielectric seal on the thin film sheet.

14. The method of claim 12, wherein forming the first and second electrodes on the substrate comprises:

forming a patterned mask layer, the patterned mask layer having holes corresponding to spaces between the first and second electrodes; and etching a conductive layer exposed by the holes of the patterned mask layer to form the first and second electrodes.

15. The method of claim 12, wherein forming the first and second electrodes on the substrate with the patterned mask layer comprises:

forming a patterned mask layer, the patterned mask layer having holes corresponding to the first and the second electrodes; and depositing a conductive material within the holes of the patterned mask layer to form the first and second electrodes.

16. The method of claim 12, wherein the first and second electrodes are a dielectric, and the method further comprises:

forming a conductive layer on the first and second electrodes.

17. A piezoelectric mechanism comprising:

a substrate;

first and second electrodes formed on the substrate, the second electrode interdigitated in relation to the first electrode, the first and the second electrodes having side surfaces at least substantially perpendicular to the substrate;

a thin film sheet formed on the substrate and within which the first and the second electrodes extend from a first surface of the thin film sheet towards a second surface of the thin film sheet opposite the first surface, wherein the thin film sheet is to physically deform in response to an electric field induced within the thin film sheet via application of a voltage across the first and the second electrodes, wherein the thin film sheet is formed by deposition of a material on the substrate between the side surfaces of adjacent first and second electrodes, wherein the first and the second electrodes are formed on the substrate and the material is deposited on the substrate to form the thin film sheet such that:

along a given axis of the plane, the thin film sheet is polarized between and at least substantially perpendicular to side surfaces of the first and the second electrodes, and along a plane parallel to a surface of the substrate on which the first and the second electrodes are formed and on which the material is deposited, the thin film sheet occupies more of the plane than the first and the second electrodes.

18. The piezoelectric mechanism of claim 17 further comprising:
a dielectric seal formed on the thin film sheet.

* * * * *